(12) United States Patent
Nakashima

(10) Patent No.: US 7,242,036 B1
(45) Date of Patent: Jul. 10, 2007

(54) SEMICONDUCTOR ELEMENT

(75) Inventor: Nobuhisa Nakashima, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 11/617,854

(22) Filed: Dec. 29, 2006

(30) Foreign Application Priority Data

Apr. 20, 2006 (JP) ............................ 2006-116631

(51) Int. Cl.
*H01L 29/74* (2006.01)
*H01L 29/744* (2006.01)

(52) U.S. Cl. ............... 257/107; 257/147; 257/E29.036; 257/E29.038

(58) Field of Classification Search ................ 257/107, 257/147
See application file for complete search history.

(56) References Cited

U.S. PATENT DOCUMENTS

| | | | | |
|---|---|---|---|---|
| 4,618,877 A | * | 10/1986 | Araki et al. ................ | 257/147 |
| 2004/0183093 A1 | * | 9/2004 | Oota et al. .................. | 257/107 |

FOREIGN PATENT DOCUMENTS

| | | |
|---|---|---|
| JP | 55-15204 | 2/1980 |
| JP | 62-136875 | 6/1987 |
| JP | 63-173363 | 7/1988 |

* cited by examiner

*Primary Examiner*—Evan Pert
(74) *Attorney, Agent, or Firm*—Oblon, Spivak, McClelland, Maier & Neustadt, P.C.

(57) ABSTRACT

A semiconductor element includes a first semiconductor layer of a first conductivity type including a non-deposition region and a deposition region. The first semiconductor layer has a first upper surface on the non-deposition region. The semiconductor element also includes a second semiconductor layer of a second conductivity type on the deposition region of the first semiconductor layer. The second semiconductor layer has a second upper surface. The semiconductor element includes first and second electrode layers on the first and second semiconductor layers, respectively, which define an inclined surface for continuous connection therebetween. The semiconductor element includes an insulating layer on the inclined surface, spaced from at least either one of the first and second electrode layers. At least either one of the first and second semiconductor layers includes a recessed portion between the respective one of the first and second electrode layers and the insulating layer.

6 Claims, 10 Drawing Sheets

SEMICONDUCTOR ELEMENT

BACKGROUND OF THE INVENTION

1) Technical field of the Invention

The present invention relates to a semiconductor element used for a contact-type semiconductor device such as a gate turn-on thyristor (GTO thyristor) and a gate commutated turn-off thyristor (GCT thyristor).

2) Description of Related Arts

Recent gate turn-on thyristors have widely been utilized as key devices of power electronics equiptments for controlling substantial current running across high potentials. Such power electronics equiptments includes, for example, a SVG (Static Var Generator), a BTB (Back To Back) system, and an inerter circuitry for driving motors of an iron-making roller.

Although not illustrated herein, the gate turn-off thyristor has a multi-layer structure of four p-n-p-n layers, which includes an n-type uppermost emitter layer (NE layer) that is etched to have a plurality of island regions, and a plurality of cathode electrodes on the island regions of the emitter layer. Also, the gate turn-off thyristor includes a p-type base layer (PB layer) beneath the uppermost layer, a gate electrode on the PB layer surrounding the island regions of the emitter layer, and an anode electrode formed on a lowermost p-type emitter layer (PE layer).

In a normal operation of the gate turn-off thyristor, it is turned on by forward pulse current running through the gate electrode while the voltage is applied between the anode and cathode electrodes, and after turning on, it can be turned off by reverse current running across the gate and cathode electrodes (self turn-off feature).

Various gate turn-off thyristors have been proposed in many references, for example, as listed below.

Japanese Patent Application JP 62-136875, A
Japanese Patent Application JP 55-136875, A
Japanese Patent Application JP 63-173363, A However, once a small amount of leak current may run, with some reasons, between the cathode electrode and the gate electrode that are arranged close to each other, the turning-off timing (switching-off point) is delayed, and also greater amount of the gate trigger current is required for turning on the thyristor. This inhibits reliable switching operation of the gate turn-off thyristor as designed.

Therefore, the present invention is to address the drawbacks and to provide a semiconductor element minimizing the leak current between the cathode electrode and the gate electrode thereof for realizing highly reliable switching operation of the semiconductor element.

SUMMARY OF THE INVENTION

Further scope of applicability of the present invention will become apparent from the detailed description given hereinafter. However, it should be understood that the detailed description and specific examples, while indicating preferred embodiments of the invention, are given by way of illustration only, since various changes and modifications within the sprit and scope of the invention will become apparent to those skilled in the art from this detailed description.

According to one of the aspects of the present invention, a semiconductor element includes a first semiconductor layer of a first conductivity type including a non-deposition region and a deposition region. The first semiconductor layer has a first upper surface on the non-deposition region. The semiconductor element also includes a second semiconductor layer of a second conductivity type on the deposition region of the first semiconductor layer. The second semiconductor layer has a second upper surface. Further, the semiconductor element includes first and second electrode layers on the first and second upper surfaces of the first and second semiconductor layers, respectively. The first and second semiconductor layers define an inclined surface for continuous connection between the first and second upper surfaces thereof. Further, the semiconductor element includes an insulating layer on the inclined surface, spaced from at least either one of the first and second electrode layers. At least either one of the first and second semiconductor layers includes a recessed portion between the respective one of the first and second electrode layers and the insulating layer.

BRIEF DESCRIPTION OF THE DRAWINGS

The present invention will more fully be understood from the detailed description given hereinafter and accompanying drawings which are given by way of illustration only, and thus are not limitative of the present invention.

DETAILED DESCRIPTION OF THE PREFERRED EMBODIMENTS

Referring to the attached drawings, the details of embodiments according to the present invention will be described herein. In those descriptions, although the terminology indicating the directions (for example, "upper" and "lower") is conveniently used just for clarity, it should not be interpreted that those terminology limit the scope of the present invention.

Figure 1:
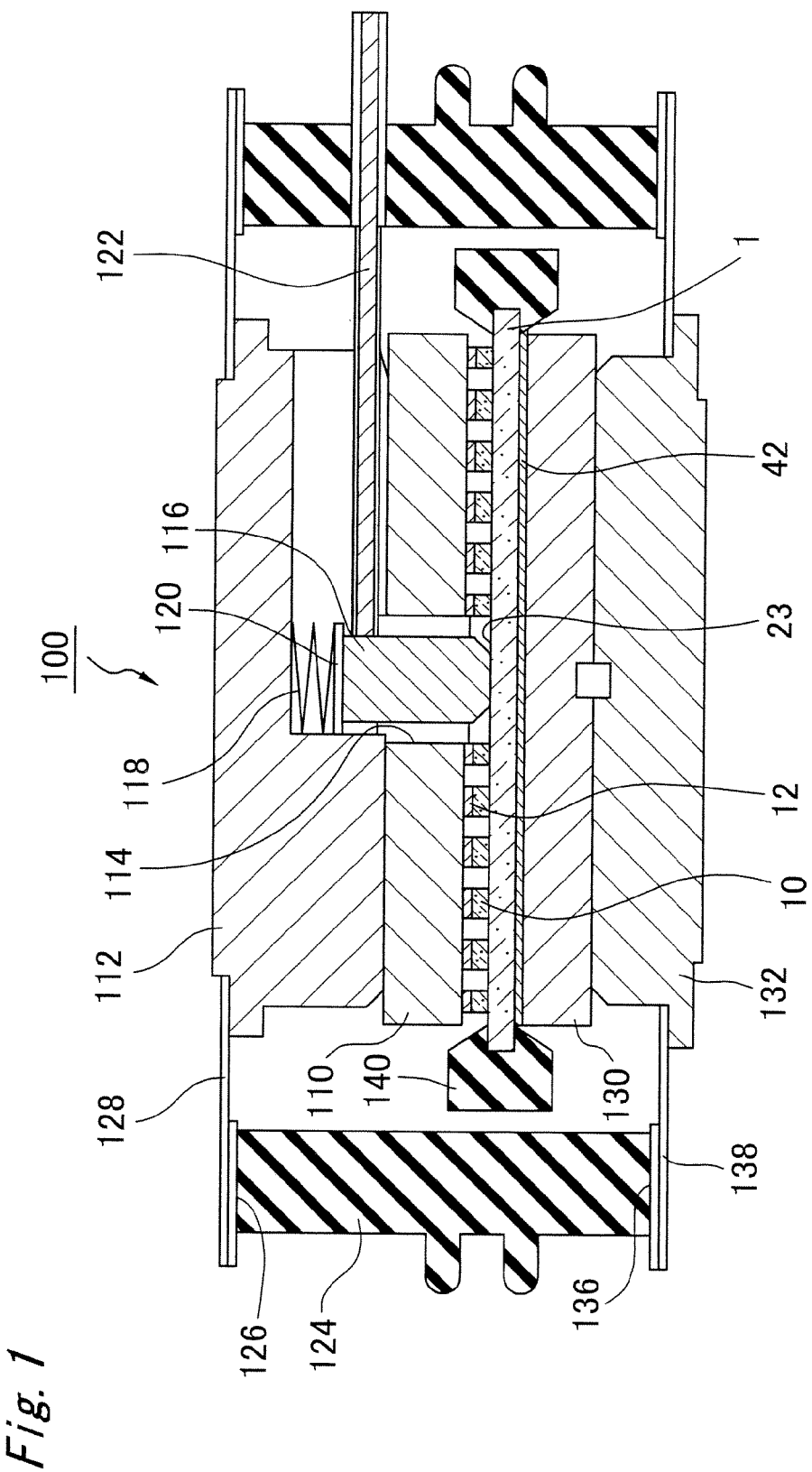
FIG. 1 is a cross sectional view according to one embodiment of a contact-type semiconductor device of the present invention.

Before describing in detail a semiconductor element according to the embodiment of the present invention, a basic structure of a semiconductor device incorporating thereof will briefly be discussed herein, with reference to FIG. 1.

Figure 2:
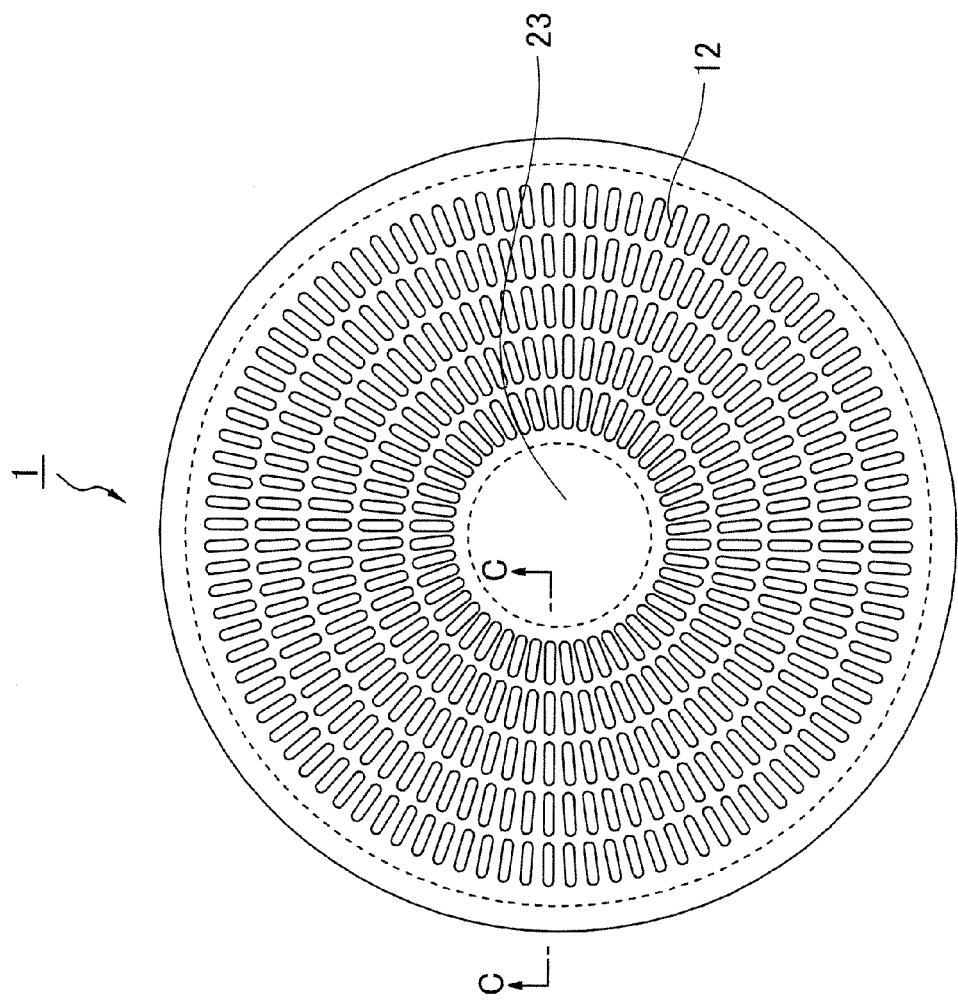
FIG. 2 is a top plan view of a semiconductor element assembled within the contact-type semiconductor device of FIG. 1.
Figure 3:
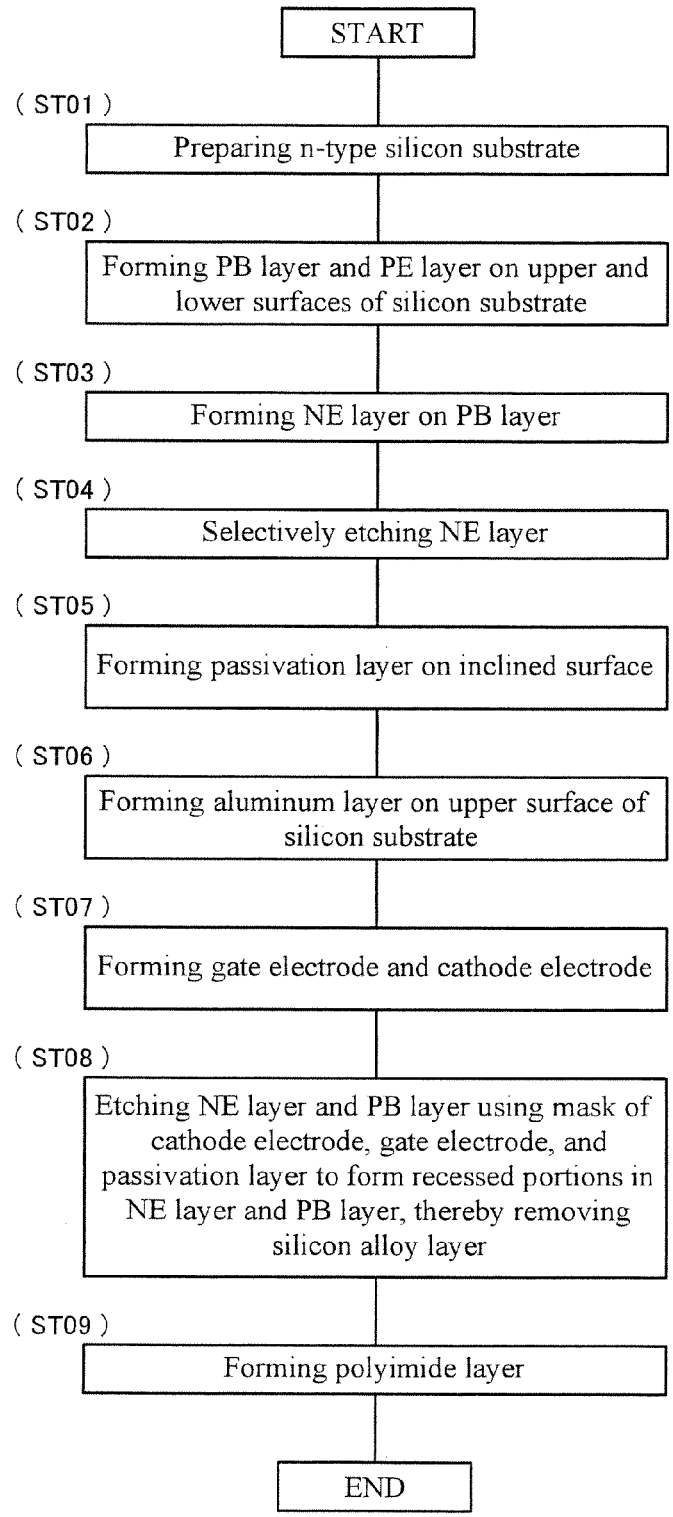
FIG. 3 is a flowchart illustrating various steps of a manufacturing process of the semiconductor element of FIG. 2.
Figure 4:
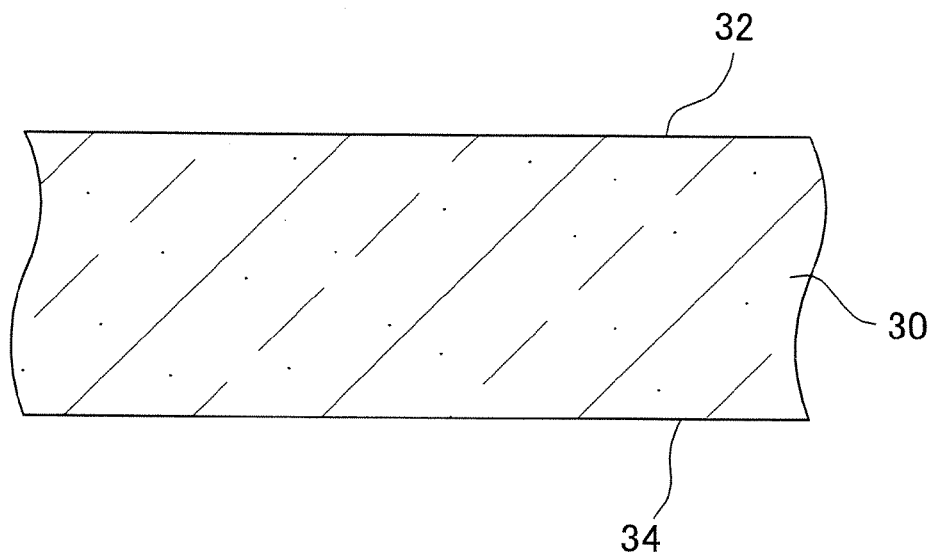
FIGS. 4-12 are cross sectional views showing one of the steps of the manufacturing process of the semiconductor element of FIG. 2.
Figure 5:
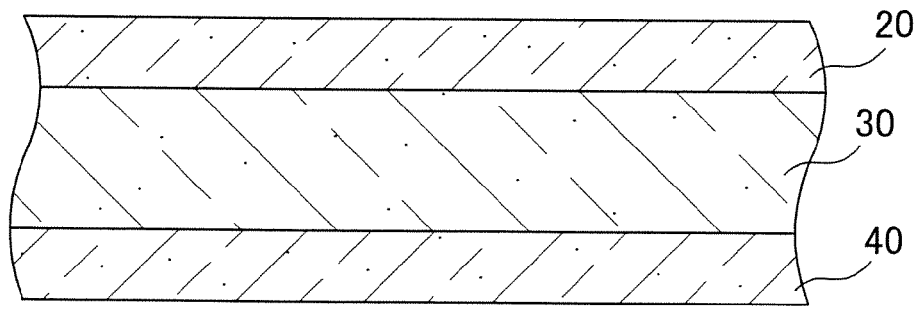

FIG. 1 is a cross sectional view according to one embodiment of a contact-type semiconductor device 100 of the present invention. FIG. 2 is a top plan view of a semiconductor element assembled within the contact-type semiconductor device 100 of FIG. 1. FIG. 3 is a flowchart illustrating various steps of a manufacturing process of the semiconductor element 100. Also, FIGS. 4-12 are cross sectional views of the semiconductor element, taken along a C-C line of FIG. 2, illustrating one of the steps of the manufacturing process of the semiconductor element 100.

Although a gate turn-off thyristor, which is referred to simply as a "GTO thyristor", is used as an example for describing the contact-type semiconductor device 100, the semiconductor element 1 of the present invention can be adapted for any other contact-type semiconductor devices such as a gate commutated turn-off thyristor (GCT thyristor).

The GTO thyristor 100 generally includes a disk-shaped semiconductor element 1 of silicon wafer (silicon substrate) as illustrated in FIG. 2. As will be described hereinafter in detail, the semiconductor element 1 includes an n-type uppermost emitter layer (NE layer) 10 that is etched to have a plurality of island regions, and a plurality of cathode electrodes 12 on the island regions of the NE layer 10. Also, the semiconductor element 1 includes a p-type base layer (PB layer) 20 beneath the uppermost NE layer 10, a gate electrode 22 on the PB layer 20 surrounding the island regions of the NE layer 10 (FIG. 10), and an anode electrode 42 formed on a lowermost p-type emitter layer (PE layer) 40 (FIG. 1). The cathode electrodes 12 are formed such that their upper surfaces have the same level (flush each other). Further, the semiconductor element 1 has a central gate portion 23 on the center region formed integrally with the gate electrodes 22 (FIG. 2).

Back to FIG. 1, the GTO thyristor 100 includes a cathode thermal-buffer plate 110 engaged with the cathode electrodes 12 of the semiconductor element 1, and a cathode terminal 112 provided thereon (and a cathode fin although eliminated for illustration). Also, the GTO thyristor 100 includes an anode thermal-buffer plate 130 engaged with the anode electrode 42 of the semiconductor element 1, and an anode terminal 132 (and an anode fin although eliminated for illustration). Each of the cathode and anode thermal-buffer plates 110, 130 has an annular body made of metal such as molybdenum, and the cathode thermal-buffer plate 110 has a through-hole 114 in the central region.

The GTO thyristor 100 includes a gate terminal 116 having a column-like configuration, which is inserted within the through-hole 114 of the cathode thermal-buffer plate 110 and contacted on the central gate portion 23 of the semiconductor element 1. The gate terminal 116 is spaced away from the cathode thermal-buffer plate 110 for isolation, and supported by the cathode terminal 112 through a biasing member (coil spring) 118 and a mica washer 120 of insulating material for biasing (forcing) the gate terminal 116 towards the central gate portion 23. The gate terminal 116 receives a control signal via a gate lead 122 from an external control circuitry (not shown) and supplies it to each of the gate electrodes 22 of the semiconductor element 1.

Further, the GTO thyristor 100 of the embodiment includes a hollow insulating cylinder 124 of insulating material such as ceramics having upper and lower ends 126, 136. The GTO thyristor 100 also has disk-shaped cathode and anode flanges 128, 138 each having an aperture defined between radially outer and inner circumferences. The radially outer circumferences of the cathode and anode flanges 128, 138 are secured on the upper and lower ends 126, 136 of the insulating cylinder 124 and the radially inner circumferences thereof are adhered on sides of the cathode and anode terminals 112, 132. Furthermore, an insulating protection member 140 is provided on the circumference of the semiconductor element 1 for improving the withstanding voltage thereof.

The components of the GTO thyristor 100 including the semiconductor element 1 so embodied, the cathode and anode thermal-buffer plates 110, 130, the cathode and anode terminals 112, 132, the gate terminal 116, the gate lead 122, and the insulating protection member 140 are housed within a space defined by the insulating cylinder 124 and the cathode and anode flanges 128, 138, which is filled up with inert gas.

In the contact-type semiconductor device 100, the cathode and anode terminals 112, 132 are pinched to each other for securing electrical connection between the cathode thermal-buffer plate 110 and the cathode electrodes 12, between the anode thermal-buffer plate 130 and the anode electrode 42, and between the gate terminal 116 and the central gate portion 23 of the semiconductor element 1.

According to the GTO thyristor 100 so structured, while a driving voltage is applied between the cathode terminal 112 and the anode terminal 132 (i.e., between each of the cathode electrodes 12 and the anode electrode 42 of the semiconductor element 1), the gate signal applied on the gate terminal 116 (and the gate electrode 22) realizes the switching operation of the semiconductor element 1.

Now referring to the flowchart of FIG. 3 and the cross sectional views of FIGS. 4-12, a manufacturing process of the semiconductor element 1 and the laminated structure of the semiconductor element 1 manufactured by the process will be described herein in detail.

In the flowchart of FIG. 3, at Step ST01 of FIG. 3, a silicon substrate (silicon wafer) 30 doped with n-type impurity is prepared. In this example, the silicon wafer having a crystal orientation of (100) is used. The impurity of boron (B) is injected into the n-type silicon substrate from the upper and lower surfaces 30, 32 thereof, which is in turn annealed at temperature of about 1250° C. for about 120 hours (ST02). This forms a p-type base layer (PB layer) 20 and a p-type emitter layer (PE layer) 40 on the upper and lower surfaces of the silicon substrate (NB layer) 30. Each of the PB layer 20 and the PE layer 40 has thickness, for example, of about 90 μm.

Figure 6:
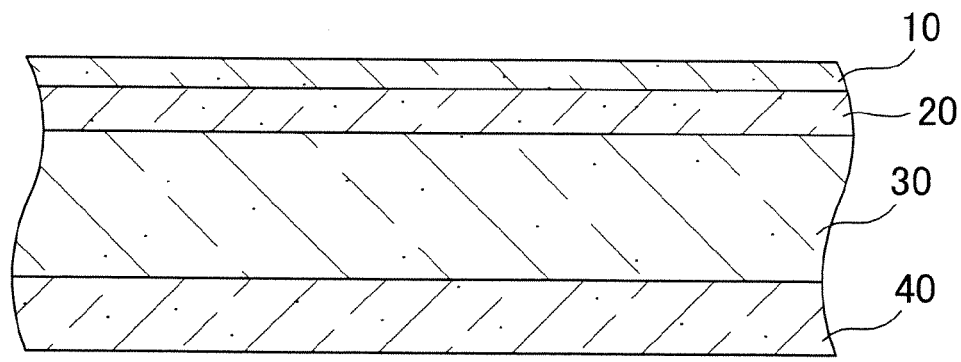

After the impurity of phosphide (P) is injected into the PB layer 20, the silicon wafer is annealed at temperature of about 1250° C. for about 25 hours (ST03), so that an n-type emitter layer (NE layer) 10 is formed on the PB layer 20, as illustrated in FIG. 6. The NE layer 10 has thickness, for example, of about 25 μm. It should be noted that a silicon dioxide layer (not shown) is formed on the upper surface of the NE layer 10 during the above annealing step, which is used as a stating material of a mask used at the next etching step as will described below.

Figure 7:
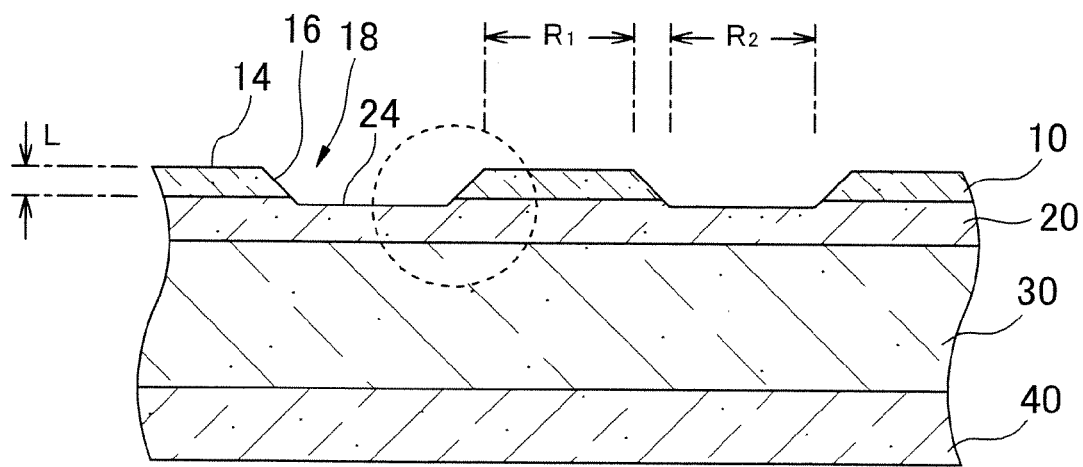
Figure 8:
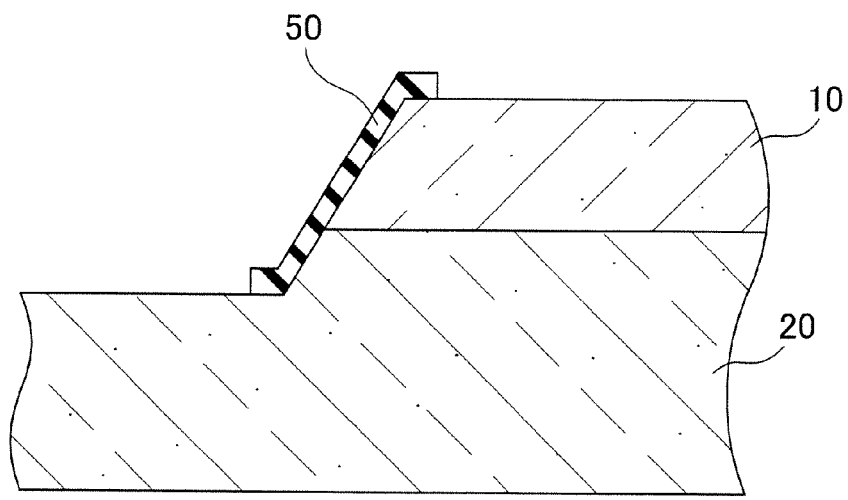

As illustrated in FIG. 7, the NE layer 10 is selectively etched (ST04). In particular, a typical photolithography technique is used for forming a photo-resist in the regions $R_1$ on the NE layer 10 corresponding to the layout of the cathode electrodes (also referred to as "deposition regions" on which the cathode electrodes will be deposited later). With use of the photo-resist as a mask and any appropriate etchant such as dilute hydrofluoric acid, the silicon dioxide layer on the NE layer 10 is selectively etched, and then the photo-resist is flushed away. Then, the silicon dioxide layer remained on the NE layer 10 is used as a mask to etch the exposed NE layer 10 (and also the PB layer 20 to some extent) with etchant of mixture of hydrofluoric acid and nitric acid (mixture ratio of 4:50) at temperature of about 10° C. for about five minutes. This causes the NE layer 10 in the region R1 to remain without being etched and to thoroughly be removed in the region R2 (referred to as a "non-deposition region") so that the upper surface 24 of the PB layer 20 is exposed. Thus, a stepped portion 18 is defined, which includes an inclined surface 16 for continuous connection between the upper surface 14 of the NE layer 10 and the upper surface 24 of the PB layer 20. In other words, the inclined surface 16 has a first inclined surface of the NE layer 10 and a second inclined surface of the PB layer 20. A vertical distance (level difference) L between the upper surface 14 of the NE layer 10 and the upper surface 24 of the PB layer 20 is, for example, about 30 μm.

Next, a passivation layer 50 of silicon dioxide ($SiO_2$) shown in FIG. 7 is formed on the inclined surface 16 which continuously connects between the upper surfaces 14, 24 of the NE layer and the PB layer 10, 20, respectively (ST05). (It is to be noted that FIGS. 8 to 13, FIGS. 16 and 17 are enlarged cross sectional views of a portion circled in the dashed line of FIG. 7, with the NB layer 30 and the PE layer (the lowermost layer) 40 eliminated for clarity.)

In particular, the NE layer and the PB layer 10, 20 are oxidized to form a silicon dioxide layer across the upper surface of the silicon substrate, i.e., on the upper surface 14 of the NE layer 10 and the upper surface 24 of the PB layer 20, which has depth of about 2 μm. A photo mask is formed solely on the inclined surface 16 by means of a typical photolithography technique to etch the silicon dioxide layer with diluted hydrofluoric acid (hydrofluoric acid:pure water=1:6). This forms the passivation layer 50 on the inclined surface 16.

Figure 9:
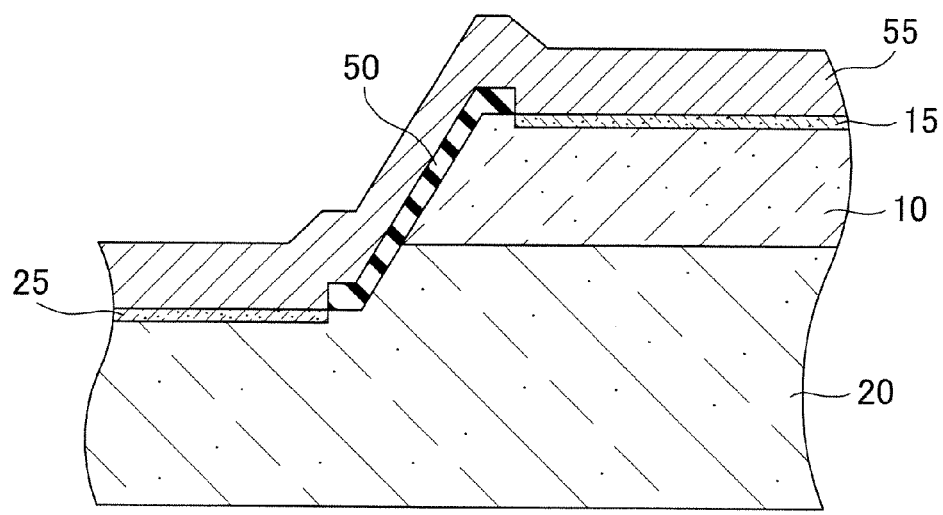

Further, with use of a commonly used aluminum spattering apparatus (not shown), an aluminum layer 55 is deposited across the surface of the silicon substrate, i.e., on the NE layer 10, the PB layer 20, and passivation layer 50, as shown in FIG. 9 (ST06). The aluminum layer 55 has thickness of, for instance, about 10 μm.

It is important to note that when depositing aluminum on the silicon substrate, aluminum atoms of high energy impinge onto the NE layer 10 and the PB layer 20 to form an aluminum-silicon alloy layers (semiconductor alloy layers) 15, 25 having depth of about 1 μm adjacent the upper surfaces 14, 24 of the NE and PB layers 10, 20 beneath the aluminum layer 55.

Figure 10:
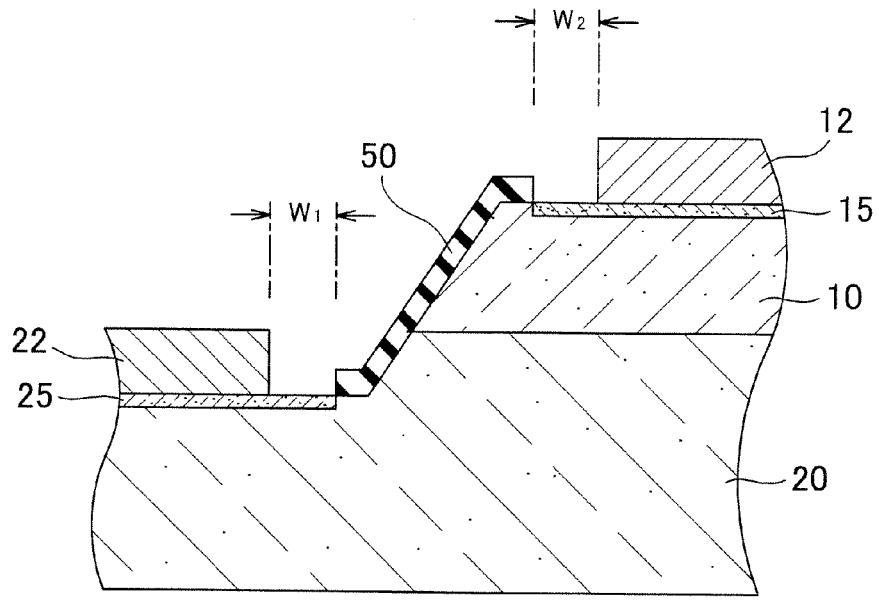
Figure 11:
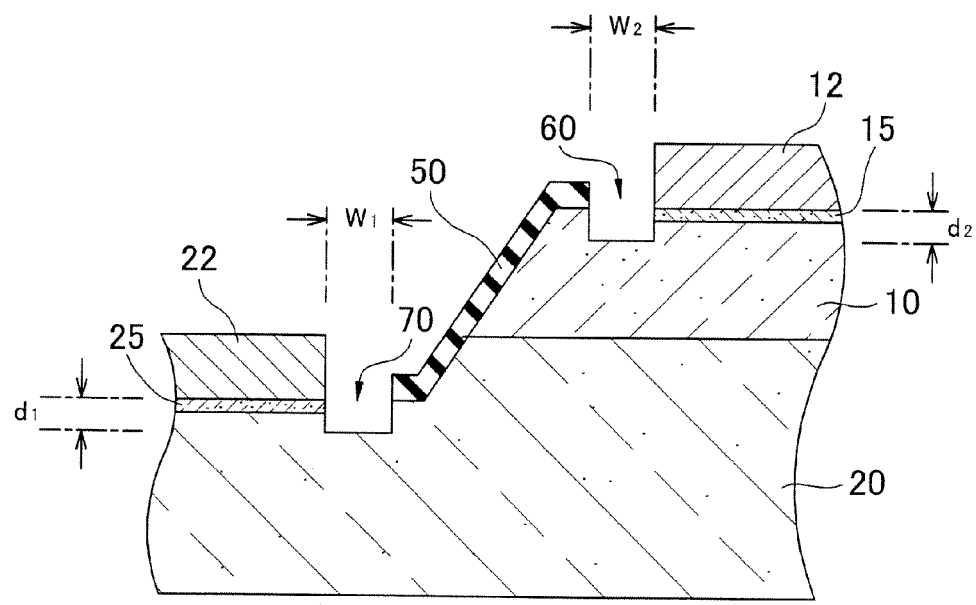

Again, with use of the typical photolithography technique, a photo-resist is formed on the aluminum layer 55 covering the regions corresponding to layouts of the gate electrode 22 and the cathode electrodes 12 of the semiconductor element 1. Then, the photo-resist is used as a mask to etch the aluminum layer 55 with the phosphoric acid for 15 minutes under reduced pressure (about 70 torr) so that the cathode electrode 12 and the gate electrode 22 are defined as illustrated in FIG. 10 (ST07).

According to the present invention, the cathode electrode 12 and the gate electrode 22 are formed as being spaced away from the passivation layer 50 by the gaps (widths) of $w_1$ and $w_2$, respectively. The widths of $w_1$ and $w_2$ may be, for example, in a range between about 10 μm through about 20 μm. However, the aluminum-silicon alloy layers 15, 25 are not etched from the upper surfaces 14, 24 of the NE and PB layers 10, 20, and thus, contacts with the passivation layer 50. Also, after formation of the cathode electrode 12 and the gate electrode 22, aluminum spattering on the lower surface of the silicon substrate (i.e., the PE layer 40) forms the anode electrode 42 thereon.

Furthermore, the semiconductor element 1 of the embodiment of the present invention includes a recessed portion (first recessed portion) 60 in the NE layer 10 between the cathode electrode 12 and the passivation layer 50, and another recessed portion (second recessed portion) 70 in the PB layer 20 between the gate electrode 22 and the passivation layer 50. In other words, the first and second recessed portions 50, 60 of the semiconductor element 1 are designed so as to remove the aluminum-silicon alloy layers 15, 25 between the passivation layer 50 and the cathode/gate electrodes 12, 22, respectively. In order to form the recessed portions 50, 60 of FIG. 10, the NE layer 10 and the PB layer 20 are etched, using the cathode electrode 12, the gate electrode 22, and the passivation layer 50 as a mask, with etchant of mixture of hydrofluoric acid and nitric acid (mixture ratio of 4:50) at room temperature for about twenty seconds (ST08).

As described above, since the recessed portions 50, 60 are to remove the aluminum-silicon alloy layers 15, 25 between the passivation layer 50 and the cathode/gate electrodes 12, 22, each of the recessed portions 50, 60 has depth of $d_1$ and $d_2$, which are greater than that of the aluminum-silicon alloy layers 15, 25, i.e., about 1 μm. Preferably, the depth $d_1$ and $d_2$ of the recessed portions 60, 70 are greater than about 3 μm, however, it has been observed that the passivation layer 50 could be peeled off if the depth $d_1$ and $d_2$ are greater than about 5 μm. Therefore, the depth $d_1$ and $d_2$ are to be set within a range between about 1 μm through about 5 μm, and preferably between about 3 μm through about 5 μm.

Lastly, a polyimide layer 80 is deposited covering the gate electrode 22 to obtain the semiconductor element 1 of the present invention (ST09).

Next, referring to FIGS. 12 to 15, a reverse withstanding voltage of the semiconductor element 1 according to the present invention will be described herein, in comparison with a conventional semiconductor element. The conventional semiconductor element of FIG. 13 has a laminated structure similar to that of the present invention of FIG. 12, except that it includes no recessed portions in the NE layer 10 and the PB layer 20 between the passivation layer 50 and the cathode/gate electrodes 12, 22, and except that the aluminum-silicon diffusing layers 15, 25 contact with the passivation layer 50.

Figure 12:
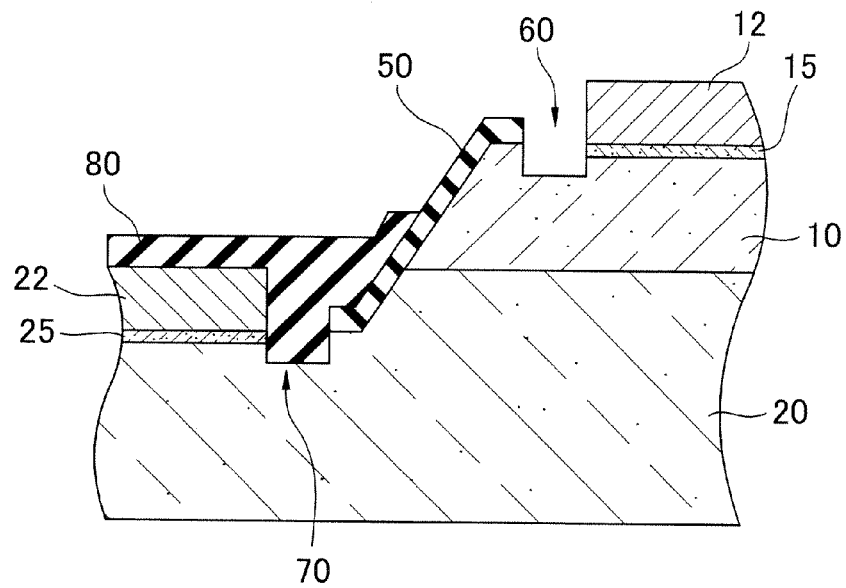
Figure 13:
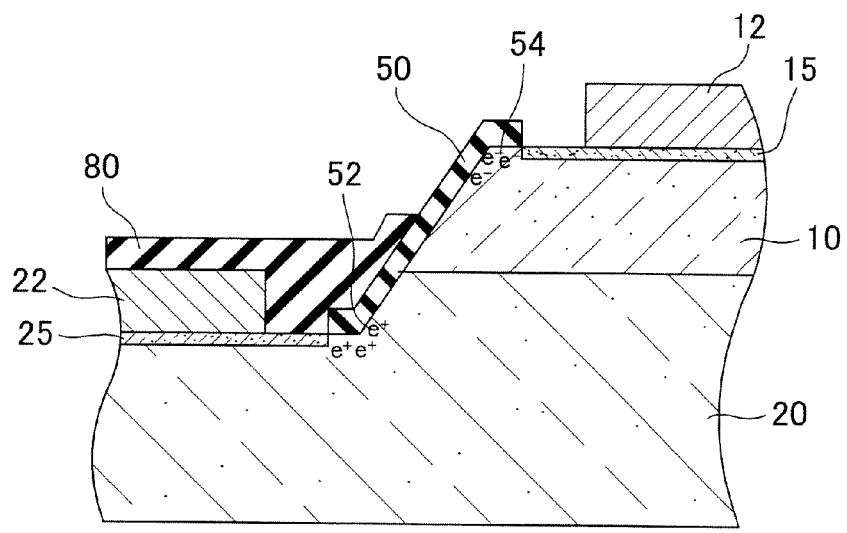
FIG. 13 is a cross sectional view of a conventional semiconductor element similar to FIG. 12.
Figure 14:
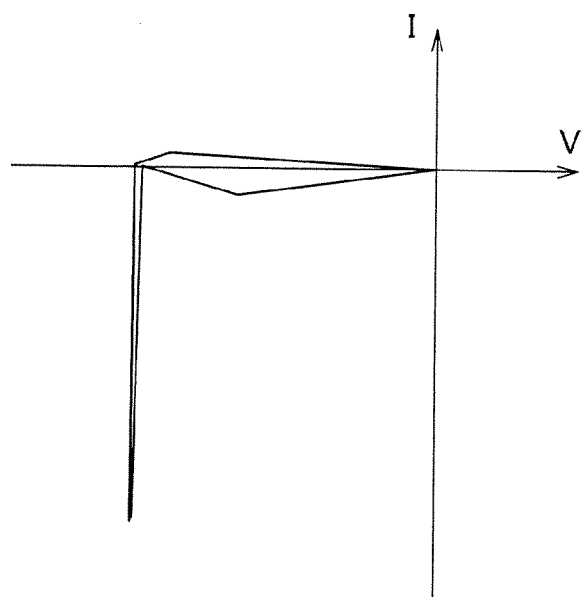
FIG. 14 is a graph showing the withstanding voltage (V-I characteristics) of the semiconductor element according to the present invention.
Figure 15:
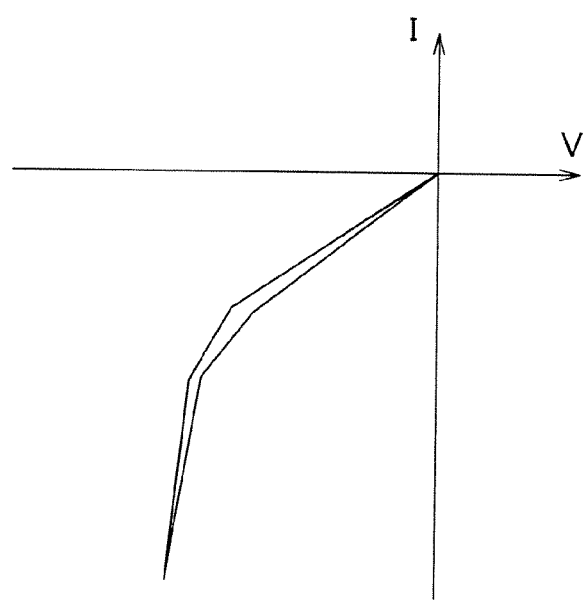
FIG. 15 is a graph illustrating the withstanding voltage (V-I characteristics) of the conventional semiconductor element.
Figure 16:
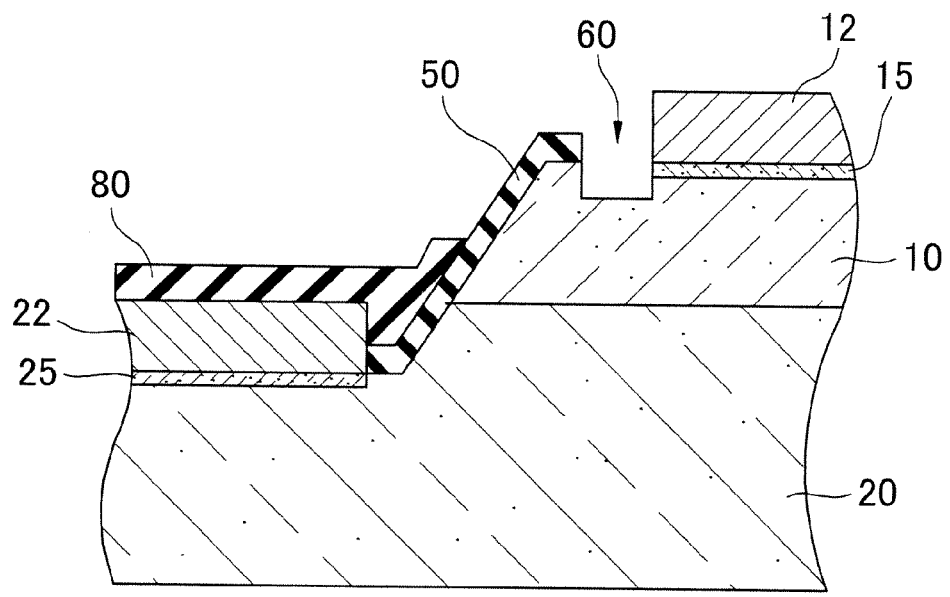
FIGS. 16 and 17 are cross sectional views of the modified semiconductor element of the present invention.
Figure 17:
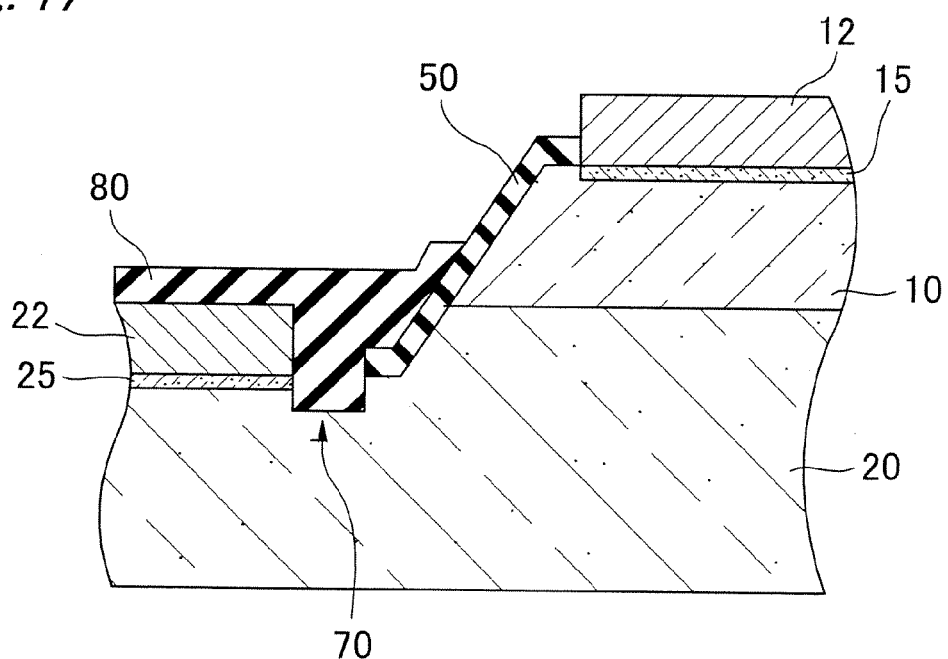

FIGS. 14 and 15 are charts plotting reverse current running between the cathode electrode 12 and the gate electrode 22, when applied with reverse voltage, (V-I characteristics) of the semiconductor elements of FIGS. 12 and 13, respectively.

As clearly illustrated in FIG. 14 showing the V-I characteristics of the present invention, it is observed that substantially no current runs between the cathode electrode 12 and the gate electrode 22 until the reverse voltage reaches to the breakdown voltage (for example, the reverse current of 0 mA at the reverse voltage of 25V), thus, the semiconductor element of the present invention is fairly good in the reverse withstanding voltage. Contrary, in FIG. 15 indicating the V-I characteristics of the conventional semiconductor element, a leak current runs between the cathode electrode 12 and the gate electrode 22 before the reverse voltage reaches to the breakdown voltage (for example, the reverse current of 25 mA at the reverse voltage of 25V).

In general, at an interface between semiconductor material and insulating material, a lattice structure of the semiconductor material is discontinuous so that the surface energy level is defined between the valence band and the conduction band of the semiconductor material. Also, thermally exited carriers (holes and electrons) may shift from the valence band via the surface energy level to the conduction band, causing a leak current that is referred to as a "surface leak current". Thus, in the embodiment, the surface energy level is defined at the passivation layer 50 and the silicon substrate, (i.e., the NE layer 10 and the PB layer 20).

Referring back to FIG. 13 showing the conventional semiconductor element, since the passivation layer 50 contacts the aluminum-silicon alloy layers 15, 25, the carriers (holes 52 and electrons 54) are supplied from the cathode and gate electrodes 12, 22 through the alloy layers 15, 25 to the surface energy level when the reverse voltage is applied between the cathode and gate electrodes 12, 22. To this result, in the conventional semiconductor element of FIG. 13, the reverse voltage applied between the cathode and gate electrodes 12, 22 causes the surface leak current running therebetween through the surface energy level as illustrated in FIG. 15. Contrary to this, in the semiconductor element 1 of FIG. 12, since the recessed portions 60, 70 are formed on the NE and PB layers 10, 20 between the passivation layer 50 and the cathode/gate electrodes 12, 22, respectively, the carriers cannot be supplied to the surface energy level from the cathode and gate electrodes 12, 22, through the alloy layers 15, 25. Therefore, the surface leak current is prevented from running between the cathode and gate electrodes 12, 22 through the surface energy level.

Thus, according to the present invention, since the surface leak current between the cathode and gate electrodes 12, 22 is inhibited for proper turning-off timing (switching-off point) and appropriate amount of the gate trigger current, a reliable switching operation of the semiconductor element 1 can be realized as designed.

As above, the recessed portions 60, 70 of the present invention are to shut off the supply of the carriers 52, 54 from the cathode and gate electrodes 12, 22 to the surface energy level, thereby inhibiting the surface leak current. Therefore, the semiconductor element 1 may be designed such that the recessed portion 60 is solely formed on the NE layer 10 between the passivation layer 50 and the cathode electrode 12, alternatively the recessed portion 70 is solely formed on the PB layer 20 between the passivation layer 50 and the gate electrode 22 for inhibiting the surface leak current.

Although the n-type semiconductor substrate is used in the above description for illustrating the process of the semiconductor element 1, another semiconductor substrate of different conductivity type (P-type) may be used as stating material for fabricating the semiconductor element 1, in which each of the laminated layers such as the NE layer 10, PB layer 20, NB layer 30 and PE layer 40 has the conductivity type opposite to that as described above.

What is claimed is:

1. A semiconductor element, comprising:
   a first semiconductor layer of a first conductivity type including a non-deposition region and a deposition region, said first semiconductor layer having a first upper surface on the non-deposition region;
   a second semiconductor layer of a second conductivity type on the deposition region of said first semiconductor layer, said second semiconductor layer having a second upper surface;
   first and second electrode layers on the first and second upper surfaces of said first and second semiconductor layers, respectively, said first and second semiconductor layers defining an inclined surface for continuous connection between the first and second upper surfaces thereof; and
   an insulating layer on the inclined surface, spaced from at least either one of said first and second electrode layers;
   wherein at least either one of said first and second semiconductor layers includes a recessed portion between the respective one of said first and second electrode layers and said insulating layer.

2. The semiconductor element according to claim 1, wherein said insulating layer is spaced from at least either one of said first and second electrode layers by 10 µm or more.

3. The semiconductor element according to claim 1, wherein the recessed portion has depth in a direction perpendicular to the first and second upper surfaces of said first and second semiconductor layers, which falls within a range between 1 µm through 5 µm.

4. The semiconductor element according to claim 1, further comprising:
   a third semiconductor layer of the first conductivity type, said third semiconductor layer having upper and lower surfaces;
   a third electrode layer on the lower surface of said third semiconductor layer;
   a fourth semiconductor layer of the second conductivity type on the upper surface of said third semiconductor layer;
   wherein said first semiconductor layer is deposited on said third semiconductor layer.

5. The semiconductor element according to claim 1, wherein said insulating layer is spaced from both of said first and second electrode layers; and
   wherein each of said first and second semiconductor layers includes the recessed portion between the respective one of said first and second electrode layers and said insulating layer.

6. The semiconductor element according to claim 1, further comprising first and second semiconductor alloy layers beneath said first and second electrode layers, respectively.

* * * * *